(12) United States Patent
Alden et al.

(10) Patent No.: US 6,434,012 B2
(45) Date of Patent: Aug. 13, 2002

(54) CIRCUIT BOARD INTERCONNECT

(75) Inventors: Wayne S. Alden, Whitman; William Petrocelli, Douglas, both of MA (US); Peter Wapenski, Foster, RI (US); Arthur G. Michaud, New Bedford, MA (US); Michael Kirkman, Swansea, MA (US); Jeffery Mason, North Attleboro, MA (US); Brian Paul Sharp, Providence, RI (US)

(73) Assignee: Tyco Electronics Logistics AG, Steinach/SG (CH)

( * ) Notice: Subject to any disclaimer, the term of this patent is extended or adjusted under 35 U.S.C. 154(b) by 0 days.

(21) Appl. No.: 09/730,322

(22) Filed: Dec. 5, 2000

Related U.S. Application Data
(60) Provisional application No. 60/181,847, filed on Feb. 11, 2000.

(51) Int. Cl.⁷ .................................................. H05K 5/00
(52) U.S. Cl. ........................ 361/752; 361/798; 361/801; 361/802
(58) Field of Search ................................ 361/724–730, 361/752, 753, 756, 759, 796–798, 802, 803; 439/325–328; 211/26; 312/223.1, 223.2

(56) References Cited

U.S. PATENT DOCUMENTS

| | | | | |
|---|---|---|---|---|
| 5,815,377 A | * | 9/1998 | Lund et al. | 361/802 |
| 6,104,613 A | * | 8/2000 | Urda et al. | 361/704 |
| 6,115,258 A | * | 9/2000 | Hoyle, Jr. et al. | 361/752 |
| 6,128,196 A | * | 10/2000 | Hoyle, Jr. et al. | 361/750 |
| 6,175,508 B1 | * | 1/2001 | McMillian et al. | 361/796 |
| 6,143,273 A1 | * | 6/2001 | Beun et al. | 361/796 |

* cited by examiner

Primary Examiner—Rainhard Cuneo
Assistant Examiner—Tuan Dinh
(74) Attorney, Agent, or Firm—Weingarten, Schurgin Gagnebin & Lebovici LLP

(57) ABSTRACT

Interconnection apparatus is provided which is especially useful to mount and connect circuit boards having a contact assembly of resilient compressive contacts to a backplane or other mateable board or device. The apparatus includes an enclosure having guide channels for each board to be housed in the enclosure, a contact assembly for providing compressive contact between the contact ends of each board and corresponding contacts of the backplane, and elements for seating each board into engagement with the backplane.

12 Claims, 7 Drawing Sheets

CIRCUIT BOARD INTERCONNECT

CROSS REFERENCE TO RELATED APPLICATIONS

The applicant claims the benefit under Title 35, USC §119(e) of United States provisional application Ser. No. 60/181,847 filed Feb. 11, 2000, the disclosure of which is incorporated herein by reference.

BACKGROUND OF THE INVENTION

A printed circuit board is described in copending application Ser. No. 09/477,847 filed Jan. 4, 2000 which comprises selected traces which terminate at a side edge of the board in an array of contact ends. The contact ends are engageable with respective compressive contacts of a contact assembly which serves to interconnect the circuit board to a backplane or other mating device or circuit. The printed circuit board is typically mounted orthogonally to a backplane and often an array of boards are mounted in an enclosure for connecting to a common backplane. This type of printed circuit board having selected traces which terminate at a side of the board in an array of contact ends is referred to herein as a side interconnect or SI board.

Appropriate hardware must be employed to achieve proper alignment of the SI boards to a backplane and to maintain proper contact force for good electrical connection between contacts of each board and contacts of the backplane. Conventionally electrical connectors are provided at a surface of each board and which are mateable with an electrical connector on the backplane. Such connectors add bulk which may limit the packing density of boards which are mateable within a single enclosure to a backplane. Such connectors also add to the electrical path length which can affect electrical performance.

BRIEF SUMMARY OF THE INVENTION

In accordance with the invention, interconnection apparatus is provided which is especially useful to mount and connect circuit boards having a contact assembly of resilient compressive contacts to a backplane or other mateable board or device. The circuit boards can be side interconnect (SI) boards. The apparatus includes an enclosure having guide channels for each SI board to be housed in the enclosure, a contact assembly for providing compressive contact between the contact ends of each board and corresponding contacts of the backplane, and elements for seating each board into engagement with the backplane.

The interconnection apparatus of the invention transfers compression forces of the interconnect contacts to the backplane and support plate and not to the card cage enclosure. The structural strength of the cage itself need not withstand the full loading forces of the cards since the loading forces are not transferred to the cage structure once the cards are seated.

BRIEF DESCRIPTION OF THE SEVERAL VIEWS OF THE DRAWING

The invention will be more fully described in conjunction with the drawings in which.

DETAILED DESCRIPTION OF THE INVENTION

Figure 1:
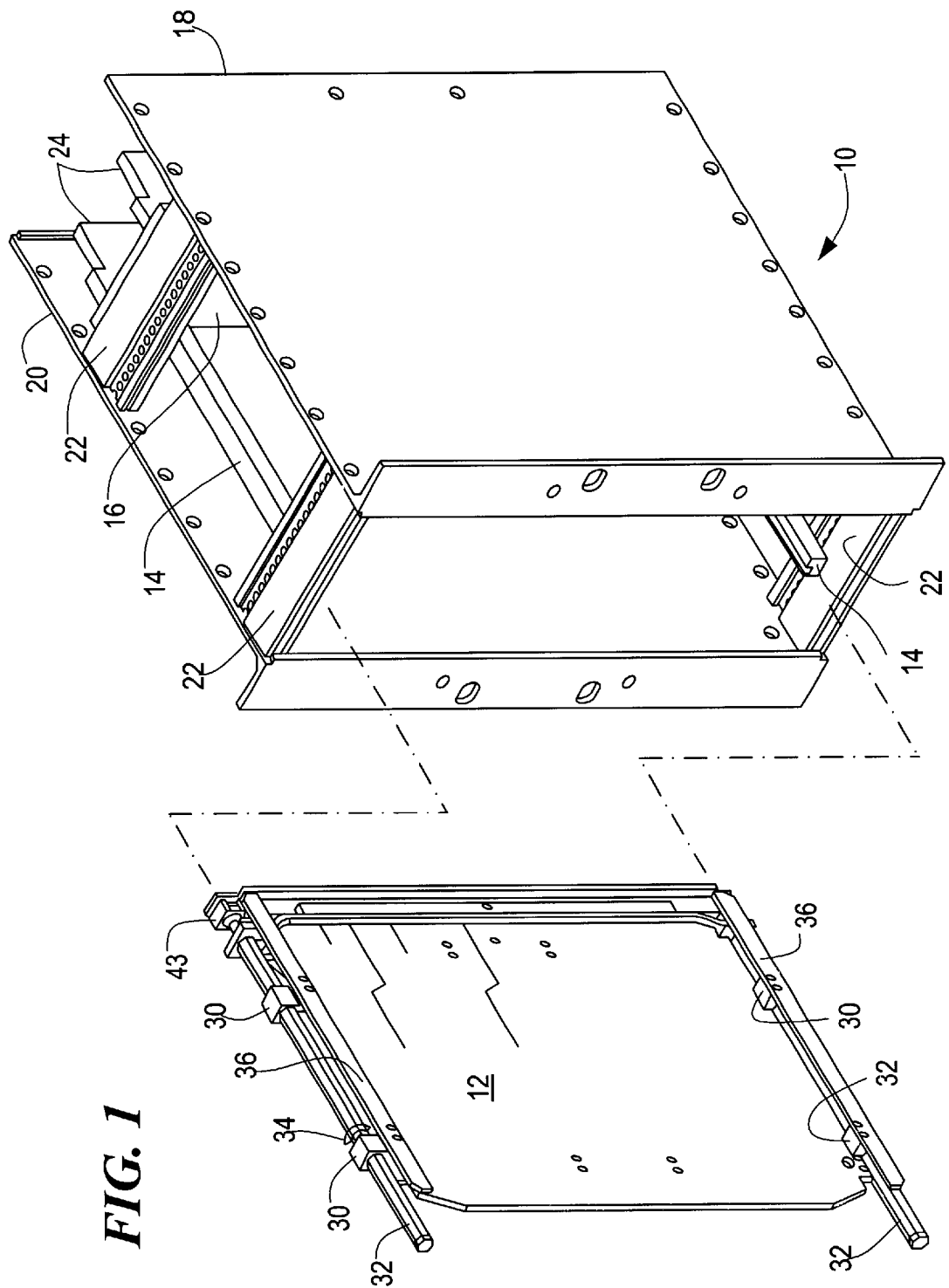
FIG. 1 is a pictorial view of a circuit card in accordance with the invention and insertable within a card cage.

A card cage having a circuit board or card installable therein is shown in FIGS. 1–4. A card rack or cage 10 is operative to retain one or more circuit cards 12 in guide channels 14 and to maintain alignment of the cards for electrical connection with contacts on a backplane 16 disposed at the inner portion of the rack. The card cage 10 is composed of sides 18 and 20 and top and bottom extrusions 22 to provide an enclosure of intended width to accommodate a given number of cards in respective guide channels. Stiffeners 24 are provided behind the backplane 16 to maintain the rigidity and planarity of the backplane. The card cage is itself known in the art.

The circuit card 12 includes blocks 30 mounted in upper and lower pairs to the upper and lower edges of the circuit card. The blocks 30 have openings therethrough for slidably accommodating the hex shaped rods 32. The inner ends of the rods 32 are threaded and are mateable with a threaded fitting on the backplane for seating the card within the card cage, as will be further described below. A C-clip 34 is provided in a groove of each rod 32 to capture the rod within the blocks 30 and prevent the rod from slipping out of the blocks. A runner 36 is provided at the top and bottom of the circuit card and is attached to respective pairs of blocks 30. The runners 36 are slidable within the respective grooves of guide channels 14 and by which the card is slidably inserted and removable from the card cage.

Figure 2:
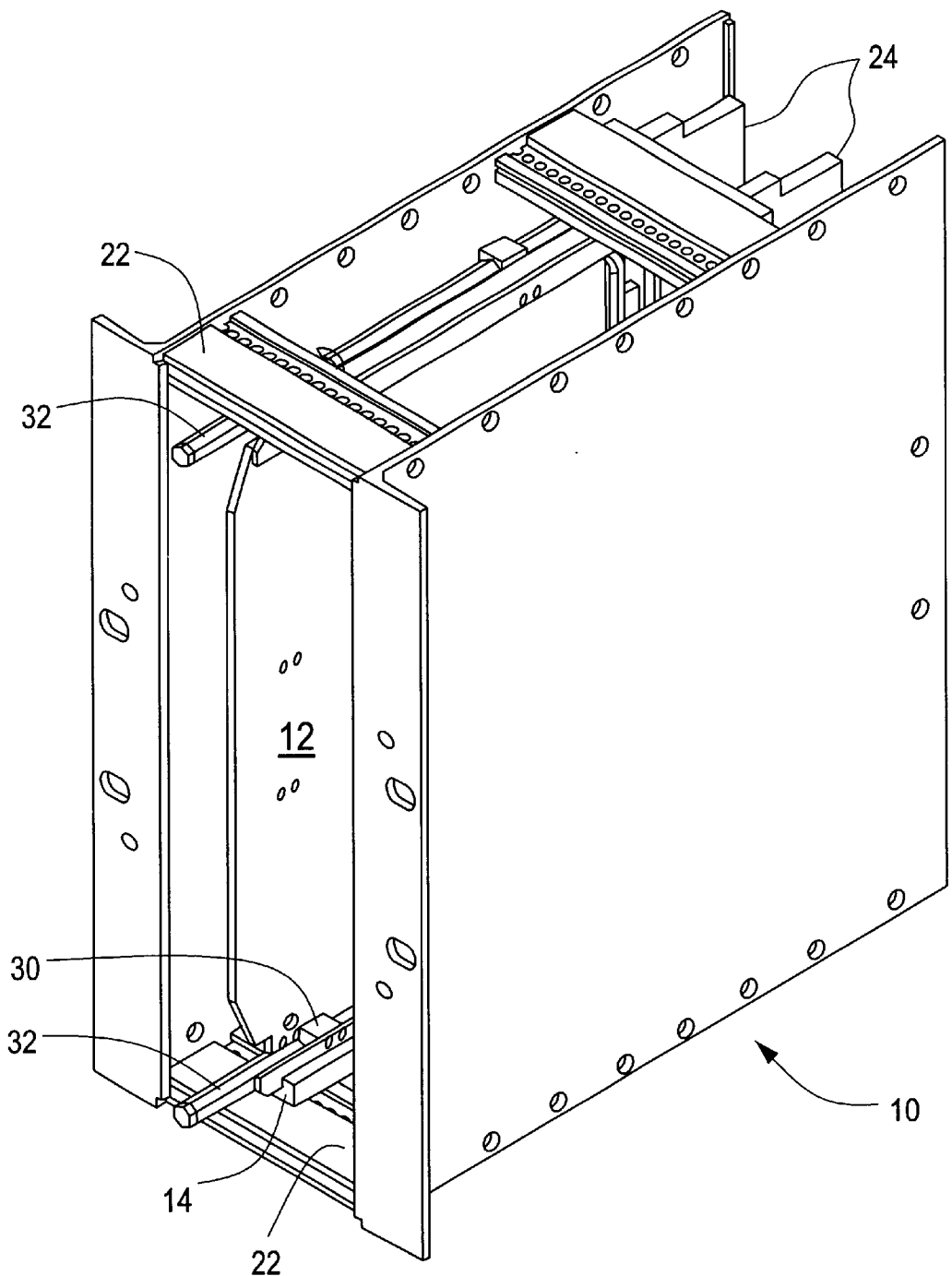
FIG. 2 is a pictorial view of the card cage with the circuit card installed.
Figure 3:
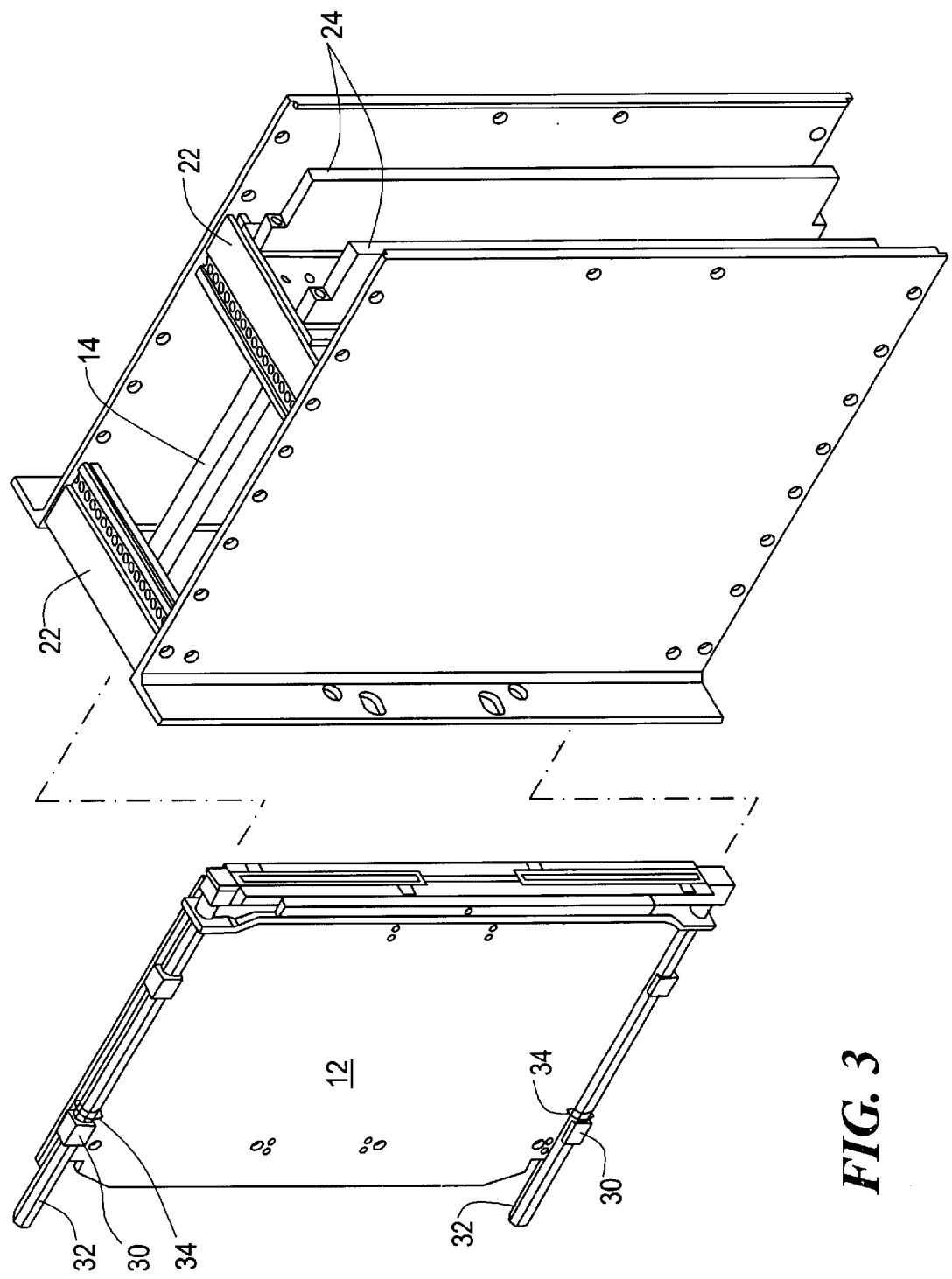
FIG. 3 is a pictorial view of the circuit card and card cage of FIG. 1 showing the connector end of the circuit card.
Figure 4:
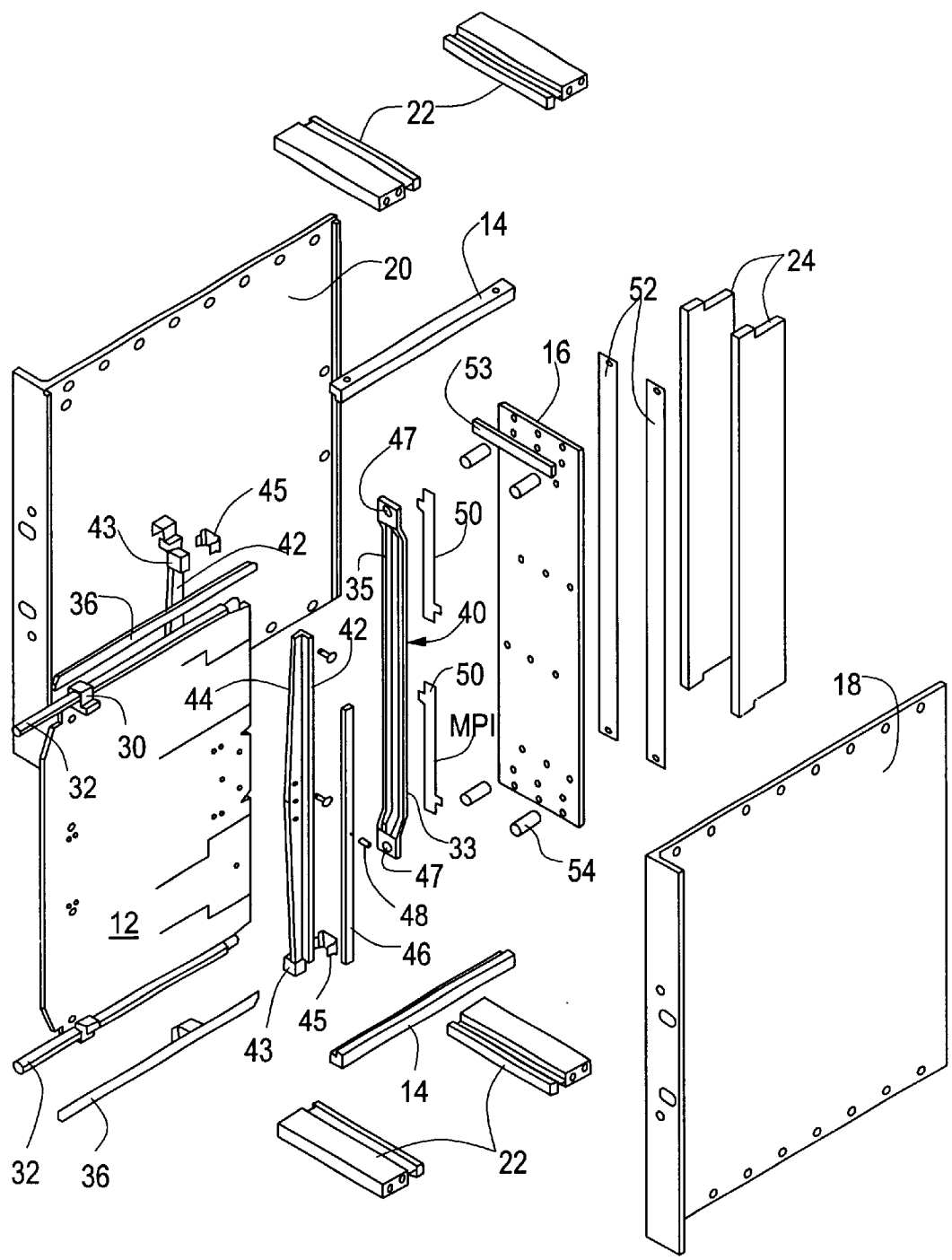
FIG. 4 is an exploded view of the components of the card cage and card assembly.

The card 12 is shown removed from the card cage in FIG. 1 and installed within the card cage in FIG. 2. FIG. 3 shows the circuit card removed from the card cage and showing the connector end of the card. FIG. 4 illustrates an exploded view of the card cage and card components.

A slotted spring element 40 is disposed at the inner end of the card 12 with the openings (47) at the top and bottom of the spring element disposed around the threaded ends of the rods 32. A pair of elements 42 are mounted to the circuit board at the rear edge thereof on respective opposite surfaces. The forward facing edge of each element 42 has a triangular configuration 44. A pivot bar 46 is pivotably attached to respective elements 42 by a pivot pin 48. The forward facing edge of each pivot bar 46 is engageable with respective web (33, 35) of slotted spring member 40. Each of the elements 42 has a fitting 43 with an opening therethrough to accommodate the rod 32. One of the fittings 43 is on the lower end of one of the elements, while the fitting on the other element 42 is on the upper end to accommodate the respective upper and lower rods.

The threaded end of each rod 32 extends through the respective openings at the upper and lower ends of the slotted spring 40. The items 45 are spring bumpers to protect the end positions of the compressive contacts in the event that the card is inserted at an angle and for the purpose of avoiding overstress of the contacts.

Figure 4A:
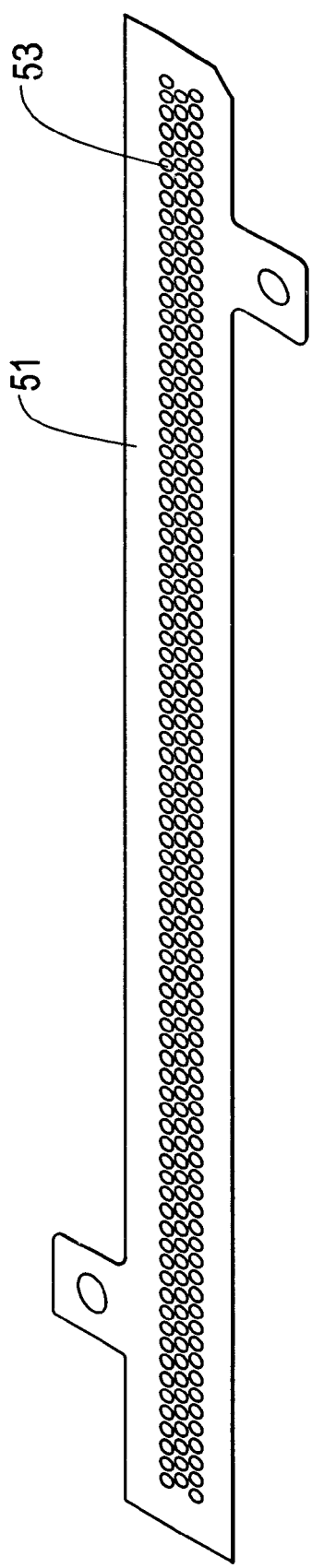
FIG. 4A is an enlarged view of the contact assembly.

The contact assemblies 50 of resilient compressive contacts are attached to the elements 42 and with the compressive contacts in engagement with respective contact ends of the circuit board 12. The contact assembly is shown in enlarged view in FIG. 4A and includes a thin substrate 51 of electrically insulative material and resilient conductive contact elements (compressive contacts) 53 retained on the substrate. The contact elements are of generally cylindrical shape having respective top and bottom ends which are engageable with the contacts of the circuit board and the contacts of the backplane, as described in the aforesaid copending patent application. Strips 52 of electrically insulating material are provided as seen in FIG. 4 to provide insulation between the backplane and stiffening members 24 and between the backplane and conductive portions of the assembly.

Threaded fittings 54 are secured through openings in the backplane and insulator strips 52 to the stiffener members 24. These fittings have female threaded receptacles for receiving the threaded ends of rods 32.

The circuit card is installed in the card cage by aligning the runners 36 with the guide channel grooves and sliding the card inward toward the backplane. The rods 32 are rotated to threadably engage the receptacles 54 to screw the card into fully seated position. The rods 32 can be rotated by a socket drive or any other suitable tool or the outer end or head end of the rod can be slotted or otherwise configured to accept a driving tool which could be a slotted or cross-slotted screwdriver or Allen style wrench. The head ends of each rod can also include a knob for manually rotation without need for a separate tool.

Figure 5:
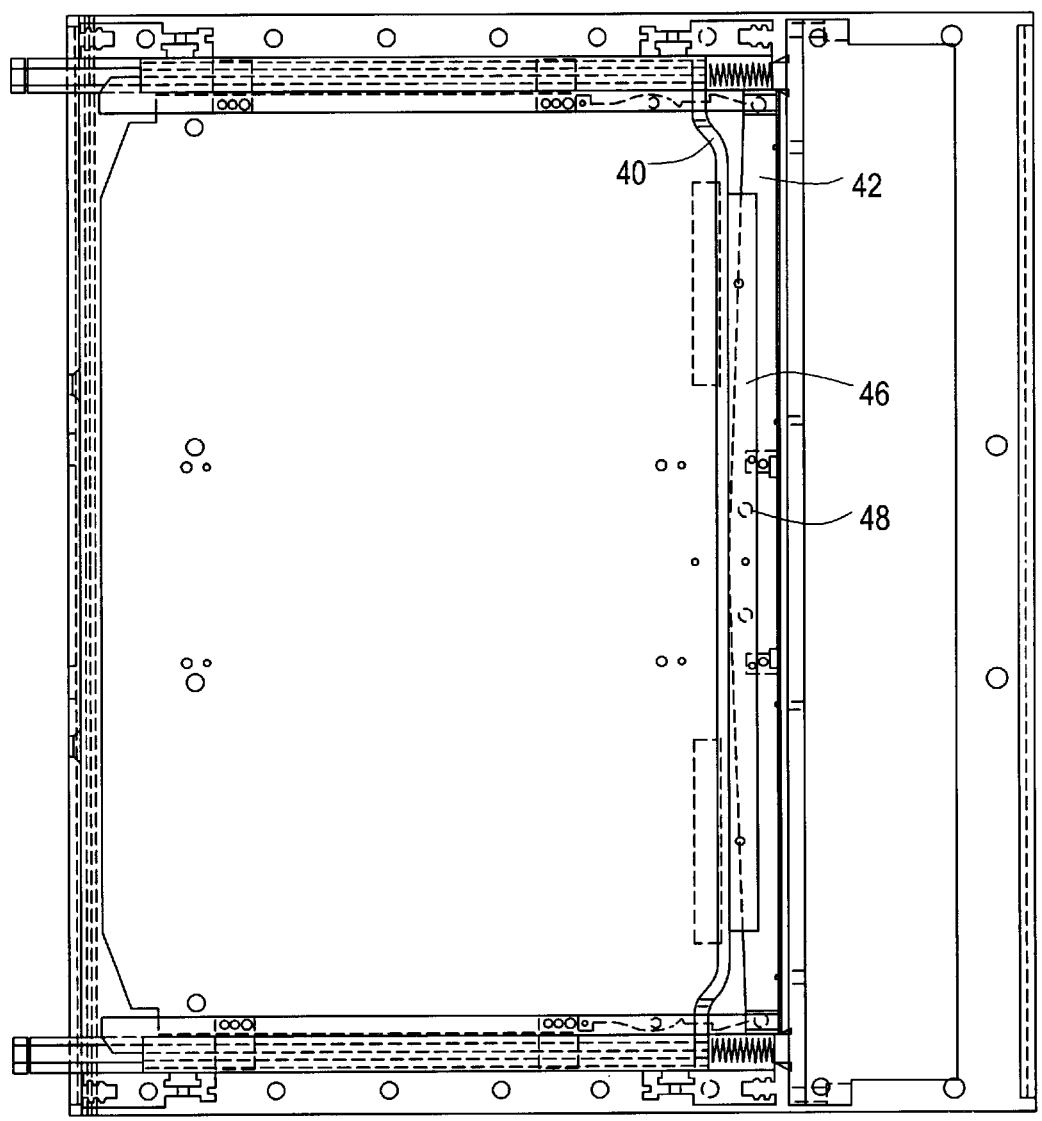
FIG. 5 is an elevation view of a circuit card in accordance with the invention partially seated in the card cage.
Figure 6:
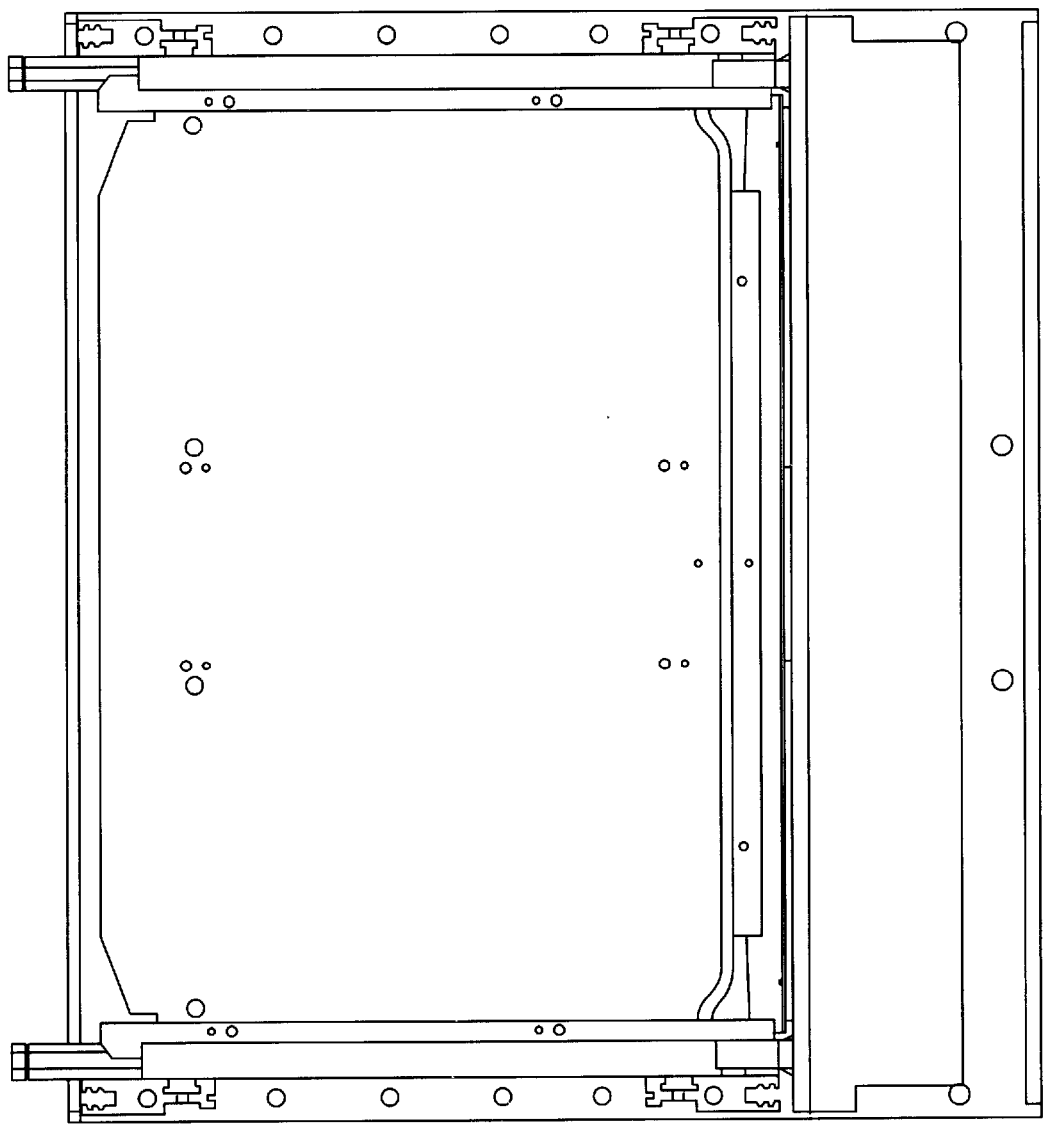
FIG. 6 is an elevation view of the circuit board in accordance with the invention fully seated in the card cage.

During seating of the card as shown in FIG. 5, the spring 40 engages the pivot bars 46 which serves to distribute the insertion force across the entire length of the elements 42. During complete seating of the card as shown in FIG. 6, the resilient compressive contacts provide connection between the respective contact ends of the circuit board and the corresponding contacts of the backplane.

The interconnection apparatus which has been described above is operative to transfer compression forces to the backplane and its support plates and not to the card cage enclosure. The slotted spring and associated elements 42 and 46 are effective to evenly load the mating edge of the card and provide uniform compressive forces on the resilient compressive contacts of the contact assemblies. As noted above, compressive forces are transferred to the backplane and support plates rather than to the card cage structure. Increasing the number of daughter cards in the card enclosure does not add any additional load to the card cage itself. A feature of the invention is that the structural strength of the card cage need not be increased to accommodate increasing numbers of cards. Thus, the cage construction can be relatively inexpensive and relatively simple.

The invention is not limited to use with an SI type of circuit card, but is useful for interconnection of daughter cards to backplanes using compressive type connectors or contacts in which an even force throughout the length of the connector is required.

Accordingly, the invention is not to be limited by the particular embodiments shown and described but is to embrace the spirit and full scope of the appended claims.

We claim:

1. A circuit board interconnect comprising;
    a printed circuit board having an upper edge and a lower edge and traces which terminate at a side edge of the board in an array of contact ends;
    a contact assembly having compressive contacts to provide electrical connection between the contact ends of the circuit board and contacts of a backplane disposed aligned with the side edge;
    a fastening mechanism for maintaining each compressive contact of the contact assembly engageable with a respective contact end of the circuit board; and
    an alignment mechanism, cooperating with the fastening mechanism, for mating the circuit board to the backplane with the compressive contacts engaging respective contacts of the backplane.

2. The circuit board interconnect of claim 1 wherein the fastening mechanism includes a spring assembly straddling the side edge of the circuit board for evenly distributing an insertion force across the entire array of compressive contacts of the contact assembly.

3. The circuit board interconnect of claim 2 wherein the spring assembly comprises:
    a slotted spring element straddling the side edge of the circuit board;
    a pair of elements mounted to the circuit board at the side edge thereof on respective opposite surfaces;
    a pair of pivot bars attached to the pair of elements by a pivot pin;
    a forward facing edge of each pivot bar engageable with a portion of the slotted spring.

4. The circuit board interconnect of claim 1 wherein the contact assembly includes a substrate of electrically insulative material and an array of resilient compressive contacts retained therein.

5. The circuit board interconnect of claim 1 wherein the alignment mechanism includes:
    first and second runners disposed respectively at the top and bottom of the circuit board.

6. The circuit board interconnect of claim 5 wherein the alignment mechanism includes first and second rods slideably attached to the respective top and bottom sides of the circuit board and each having a fastener mateable with a cooperative fastener for retaining the circuit board in aligned position with the backplane.

7. The circuit board interconnect of claim 1 wherein the alignment mechanism includes:
    a first pair of blocks mounted on the upper edge of the circuit board;
    a second pair of blocks mounted on the lower edge of the circuit board;
    each of the pair of blocks having aligned openings therethrough;
    first and second rods each slidable disposed within a respective pair of blocks, each of the rods having a fastener at an inner end thereof, the fastener being mateable with a cooperative fastener for retaining the circuit board in aligned position with the backplane.

8. The interconnection apparatus of claim 1 wherein the alignment mechanism includes first and second rods slideably attached to the respective top and bottom of the circuit board and each having a threaded end cooperative with a mating connector on the backplane to seat the circuit board in aligned position on the backplane.

9. The circuit board interconnect of claim 7 wherein the alignment mechanism includes:
    a slotted spring element disposed at the side edge of the circuit board and having first and second webs on respective sides of a slot, and an opening at each end of the element disposed about the fastener end of the respective rods;
    first and second elements mounted to the circuit board at the side edge thereof on respective opposite surfaces having a fitting respectively at the upper edge and the lower edge of the board, each fitting disposed about a respective rod, the forward facing edge of each element having a triangular configuration;

a pair of pivot bars each pivotably attached to respective elements by a pivot pin;

the forward facing edge of each pivot bar being engageable with a respective web of the slotted spring element.

10. The circuit board interconnect of claim 6 wherein the fasteners on the first and second rods are threaded fasteners.

11. Interconnection apparatus comprising:

an enclosure having a front and a back;

a backplane mounted in the enclosure;

at least one pair of guides extending from the front to the back of the enclosure and operative to orient a circuit board orthogonal to the backplane and to align contact ends of the circuit board with reference to contacts of the backplane;

a circuit board disposable in the pair of guides and having traces which terminate at a side edge of the board in an array of contact ends;

a contact assembly on the end of the circuit board containing the array of contact ends and having compressive contacts engageable with respective contact ends;

a pair of runners mounted on the circuit board and operative to engage the pair of guides and orient the board in the enclosure and align the contact ends of the board with reference to the backplane;

a spring assembly on the circuit board for evenly distributing the insertion force across the entire array of compressive contacts; and a fastening mechanism for retaining the board and contact assembly in seated position with each compressive contact engaged with a respective contact end of the board and respective backplane contact.

12. The interconnection apparatus of claim 11 wherein the fastening mechanism includes threaded fittings connected to backplane, the receptacles being cooperative to receive threaded fittings of the circuit board.

* * * * *

UNITED STATES PATENT AND TRADEMARK OFFICE
CERTIFICATE OF CORRECTION

PATENT NO.    : 6,434,012 B2
DATED         : August 13, 2002
INVENTOR(S)   : Wayne S. Alden et al.

It is certified that error appears in the above-identified patent and that said Letters Patent is hereby corrected as shown below:

Column 4,
Line 56, "position on the" should read -- position to the --;
Line 58, "alignment" should read -- fastening --;

Column 6,
Line 18, "fittings" should read -- receptacles --;
Line 19, "backplane," should read -- the backplane, --.

Signed and Sealed this

Nineteenth Day of August, 2003

JAMES E. ROGAN
*Director of the United States Patent and Trademark Office*